United States Patent
Wu et al.

(10) Patent No.: US 10,295,435 B1
(45) Date of Patent: May 21, 2019

(54) MODEL-BASED DAMAGE DETECTION TECHNIQUE FOR A STRUCTURAL SYSTEM

(71) Applicant: Bentley Systems, Incorporated, Exton, PA (US)

(72) Inventors: Zheng Y. Wu, Watertown, CT (US); Guoqing Xu, Bellevue, WA (US)

(73) Assignee: Bentley Systems, Incorporated, Exton, PA (US)

( * ) Notice: Subject to any disclaimer, the term of this patent is extended or adjusted under 35 U.S.C. 154(b) by 831 days.

(21) Appl. No.: 14/742,330

(22) Filed: Jun. 17, 2015

(51) Int. Cl.
  *G01M 5/00* (2006.01)
  *G01M 7/00* (2006.01)
  *G05B 23/02* (2006.01)
  *G06F 17/50* (2006.01)

(52) U.S. Cl.
  CPC .............. *G01M 7/00* (2013.01); *G01M 5/00* (2013.01); *G01M 5/0033* (2013.01); *G01M 5/005* (2013.01); *G01M 5/0075* (2013.01); *G05B 23/0243* (2013.01); *G06F 17/5009* (2013.01); *G06F 17/5018* (2013.01)

(58) Field of Classification Search
  CPC .. G01M 5/0033; G01M 5/005; G01M 5/0075; G01M 7/00; G05B 23/0243; G06F 17/5009; G06F 17/5018
  See application file for complete search history.

(56) References Cited

U.S. PATENT DOCUMENTS

| 6,006,163 | A | 12/1999 | Lichtenwalner et al. |
| 6,711,952 | B2 * | 3/2004 | Leamy ................... F01D 21/00 73/579 |
| 7,908,095 | B2 | 3/2011 | Liu et al. |
| 8,209,134 | B2 | 6/2012 | Parker et al. |

(Continued)

OTHER PUBLICATIONS

Doebling, S. W., Farrar, C. R., Prime, M. B., and Shevitz, D. W., "Damage identification and health monitoring of structural and mechanical systems from changes in their vibration characteristics: A literature review," Technical Report, LA—13070-MS, Los Alamos National Lab., NM, May 1996, pp. 1-134.

(Continued)

*Primary Examiner* — Sujoy K Kundu
*Assistant Examiner* — L. Anderson
(74) *Attorney, Agent, or Firm* — Cesari and McKenna, LLP; James A. Blanchette (57) ABSTRACT

In one example embodiment, an analysis software package implements an improved damage detection technique to identify damaged elements of a structure. The software package accesses a model and receives measured responses resulting from physical testing of the structure under initial conditions and under damaged conditions. The analysis software package may search for a set of damaged elements, wherein the searching is based on an error function that evaluates goodness-of-fit between the model and the structure under damaged conditions based on a discrepancy between a modeled response difference and a measured (Continued)

response difference, wherein the modeled response difference is a difference between modeled responses determined from the model configured to model initial conditions and with selected damaged elements, and the measured response difference is a difference in measured responses determined from physical testing of the structure under the initial conditions and under the damaged conditions.

19 Claims, 6 Drawing Sheets

(56) References Cited

U.S. PATENT DOCUMENTS

| | | | |
|---|---|---|---|
| 8,285,495 | B2 | 10/2012 | Purekar et al. |
| 8,387,469 | B2 | 3/2013 | Okoli et al. |
| 2011/0029276 | A1 | 2/2011 | Cabral Martin |
| 2012/0250004 | A1 | 10/2012 | Parker et al. |
| 2014/0058709 | A1 | 2/2014 | Machado Viana et al. |

OTHER PUBLICATIONS

Farrar, C. and Jauregui, D., "Damage Detection Algorithms Applied to Experimental and Numerical Modal Dta from the I-40 Bridge.," Technical Report, Los Alamos National Laboratory, Los Alamos, NM 87545, USA, Jan. 1996, pp. 1-135.

Sanayei, M., Bell, E. S., Javdekar, C. N., Edelmann, J. L., and Slaysky, E., "Damage Localization and FiniteElement Model Updating Using Multiresponse NDT Data," Journal of Bridge Engineering, 11(6), Nov. 2006., pp. 688-698.

STAAD.Pro: Technical Reference Manual, V8/ (SELECTseries ), Bentley Systems, Inc., Exton, PA, <http://www.bentley.com>, Nov. 19, 2012, pp. 1-775.

U.S. Appl. No. 14/563,668, filed Dec. 8, 2014 by Zheng Yi Wu et al. for Optimizing Sensor Placement for Structural Health Monitoring, pp. 1-34.

Wang, X., Swanson, J. A, Helmicki, A J., and Hunt, V. J., "Development of Dynamic-Response-Based Objective Functions for Finite-Element Modeling of Bridges," Journal of Bridge Engineering, 12(5), Sep./Oct. 2007, pp. 552-559.

Wang, X., Swanson, J. A, Helmicki, A J., and Hunt, V. J., "Development of Static-Response-Based Objective Functions for Finite-Element Modeling of Bridges," Journal of Bridge Engineering, 12(5), Sep./Oct. 2007, pp. 544-551.

Wu, Z. Y. & Xu G., "Effective Method for Locating Damage Elements by Parallel Optimization of Model Updating," Proceeding of SHMII-5. Cancun, Mexico, Dec. 11-15, 2011, pp. 1-11.

WU, Z. Y., Wang, Q, Butala, S. and Mi T., "Generalized Framework for High Performance Infrastructure System Optimizaiton," Proceeding of International Conference on Computing and Control for Water Industry, Sep. 3-7, 2011, Exeter, UK, pp. 1-6.

Wu, Z. Y. and Xu G., "Integrated evolutionary optimization framework for finite element model identification. First Middle East Conference on Smart Monitoring, Assessment and Rehabilitation of Civil Infrastructure," Feb. 8-11, 2011, Dubai, UAE, pp. 1-8.

\* cited by examiner

MODEL-BASED DAMAGE DETECTION TECHNIQUE FOR A STRUCTURAL SYSTEM

BACKGROUND

Technical Field

The present disclosure relates generally to detecting damage to a structure, and more specifically to model-based damage detection techniques that compare modeled and field-tested responses to detect damage to a structure.

Background Information

Structural deterioration is inevitable for structures (e.g., bridges, dams, buildings, and other civil infrastructure) that are subjected to adverse operational and environmental conditions over long service lives. For example, in the year 2006, over 26% of the 600,905 bridges in the United States were rated as structurally deficient or functionally obsolete. As these structure further age, they will likely suffer further structural damage due to their ongoing deterioration. Some of this structural damage, if unaddressed, could lead to catastrophic failure.

To try to combat this issue, many structures are periodically inspected to attempt to detect damaged structural members. For example, in the case of bridges in the United States, biennial bridge inspection is mandated by the Federal Highway Administration (FHWA). Typically, such inspection is a manual process, performed primarily visually by skilled engineers, who try to detect the damaged members. However, even if diligently performed, visual inspection generally cannot detect all forms of structural damage.

A number of model-based damage detection techniques have been developed that attempt to replace and/or supplement visual inspection. Model-based approaches often utilize a comparison of modeled response and field-tested response, to attempt to detect damaged elements. In a typical implementation, a model of the structure in healthy (i.e. un-damaged condition) is generated. The model is used to calculate a modeled responses to modeled impulses. Further, a number of sensors (e.g., accelerometers) are attached to the actual structure to measure response to actual impulses. An attempt is made to detect potentially damaged members in the actual structure by identifying damaged elements in the model. One technique uses a discrepancy between the modeled responses and the measured responses as an evaluation criteria for the damage detection.

However, there are a number of problems with this traditional approach to model-based damage detection. These problems may explain why model-based damage detection has not been widely adopted by professionals in the field, and has been mainly of academic interest. Two problems that may be key to the lack of adoption are 1) difficulty in accommodating uncertainties (e.g., inaccuracies) in the model and noise in the measured responses, and 2) a lack of an effective and efficient solution method suited for use with larger structures.

First, traditional model-based damage detection techniques are severely affected by uncertainties in the model and noise in the field measurements. In a technique that uses discrepancy between modeled responses and measured responses as an evaluation criteria, any uncertainty in the model that causes it to diverge from the actual structure will have a significant effect. The uncertainty may mask damage, since the change in response due to damage may be the same order of magnitude as the change in response due to the uncertainty. In many cases, the latter may be even greater than the form. A similar situation exists with noise in the measured responses. Such noise may further mask damage, causing the techniques to fail to detect some damage and/or incorrectly identify the location of damage.

Second, traditional model-based damage detection techniques are generally poorly suited for use with large-sized structures. A large structure may be modeled using hundreds, thousands or even tens of thousands of elements. Using traditional solution methods, a damage detection formulation involving hundreds, thousands or tens of thousands of variables would be generated. The dimension of the problem may prevent effective and efficient solution.

Accordingly, there is a need for improved model-based damage detection techniques that may 1) better accommodate uncertainties in a model and noise in measured responses, and 2) better handle large structures modeled using large numbers of elements.

SUMMARY

In one example embodiment, an improved model-based damage detection technique addresses at least some of the problems of prior techniques. Rather than use a discrepancy between modeled responses and measured responses as evaluation criteria, the improved model-based damage detection technique may use a discrepancy between a modeled response difference and a measured response difference as evaluation criteria. The modeled response difference may be a difference between modeled responses determined from a finite element (FE) model when it is configured to model initial (e.g., un-damaged) conditions and when it is configured to model selected damaged elements. The measured response difference may be a difference in measured responses determined from physical testing of the structure under initial conditions and under damaged conditions. Further, rather than utilize a number of decision variables equal to, or otherwise on the same order as, the number of elements represented by the FE model, the improved model-based damage detection technique may limit the number of decision variables to twice a maximum number of damaged elements, where the maximum number of damaged elements is at least an order of magnitude less than the number of elements in the FE model, and preferably two orders of magnitude less than the number of elements in the FE model.

The improved model-based damage detection technique may be implemented by an analysis software package executing on an electronic device. The analysis software package may access the FE model and receive measured responses resulting from physical testing of the structure. The analysis software package may then search for a set of damaged elements, wherein the searching is based on an error function that evaluates goodness-of-fit between the FE model and the structure under damaged conditions, based on a discrepancy between the modeled response difference and the measured response difference. The searching may be performed in an iterative manner. Initially, the analysis software package may update the FE model to model the proposed set of damaged elements according to the proposed damage parameters. The updated FE model may be analyzed to calculate responses, and the error function computed. Using the error from the error function, the solutions may be evolved to minimize the error using, for example, a genetic algorithm. The process may be iteratively repeated until a stopping criteria is reached, and the solutions at the stopping criteria are returned. The returned solutions may be displayed to a user, who may use them to direct repairs to the structure It should be understood that a variety of additional features and alternative embodiments may be implemented other than those discussed in this Summary. This Summary is intended simply as a brief introduction to the reader for the further description which follows, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
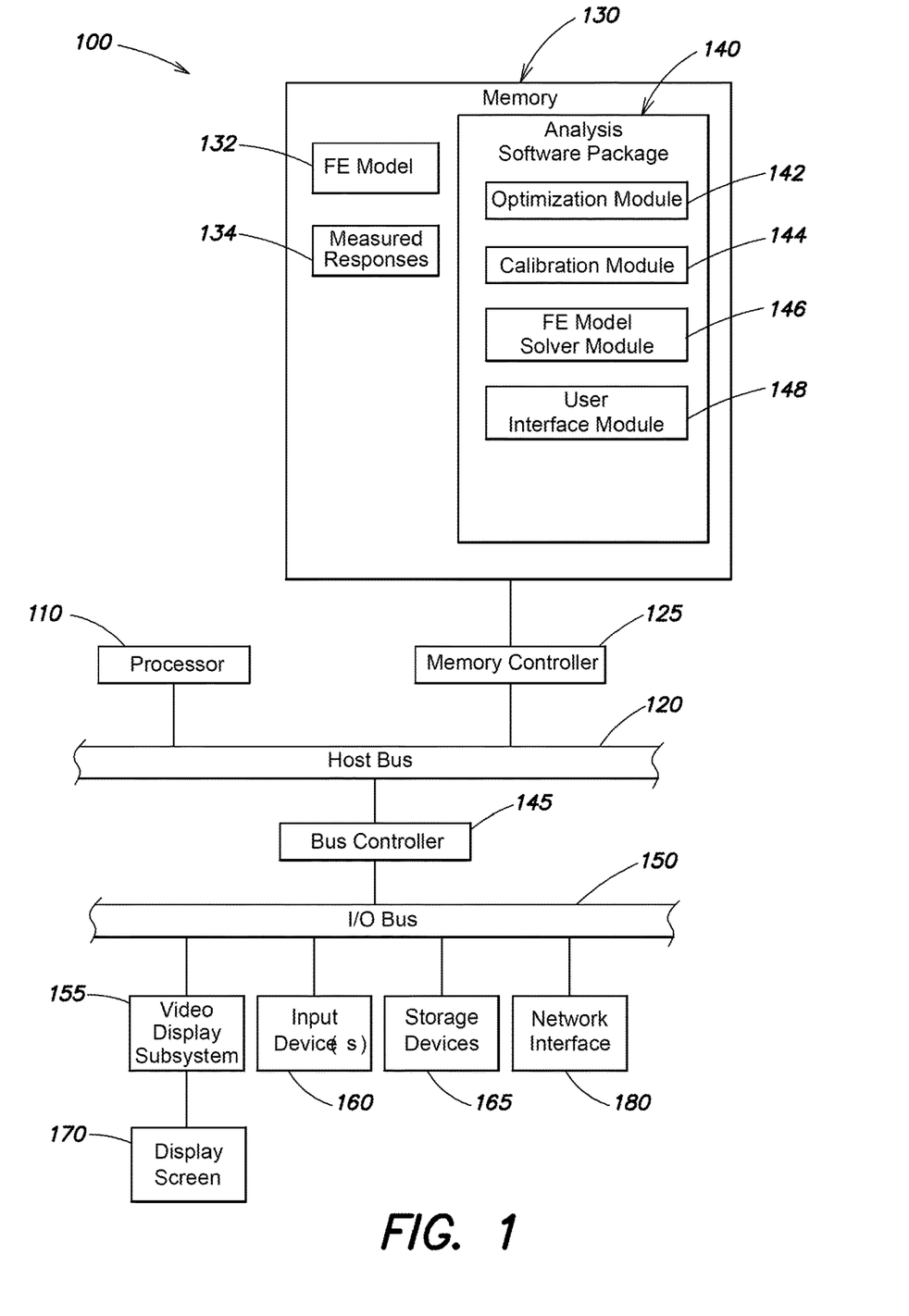
FIG. 1 is a block diagram of an example electronic device (e.g., a computer) that may be used with the present techniques.

FIG. 1 is a block diagram of an example electronic device 100 (e.g., a computer) that may be used with the present techniques. The electronic device 100 includes at least one processor 110 coupled to a host bus 120. The processor 110 may be any of a variety of commercially available processors, such as an Intel x86 processor, or another type of processor. A volatile memory 130, such as a Random Access Memory (RAM) is also coupled to the host bus via a memory controller 125. When in operation, the memory 130 stores processor-executable instructions and data that are provided to the processor 110. An input/output (I/O) bus 150 is accessible to the host bust 120 via a bus controller 145. A variety of additional components are coupled to the I/O bus 150. For example, a video display subsystem 155 is coupled to the I/O bus 150. The video display subsystem 155 may include a display screen 170 and hardware to drive the display screen. At least one input device 160, such as a keyboard, a touch sensor, a touchpad, a mouse, etc., is also coupled to the I/O bus 150. A persistent storage device 165, such as a hard disk drive, a solid-state drive, or another type of persistent data store, is further attached, and may persistently store the processor-executable instructions and data, which are loaded into the volatile memory 130 when needed. Still further, a network interface 180 is coupled to the I/O bus 150. The network interface enables communication over a computer network, such as the Internet, between the electronic device 100 and other electronic devices, using any of a number of well-known networking protocols. Such communication may enable collaborative, distributed, or remote computing with functionality spread across multiple electronic devices.

Working together, the components of the electronic device 100 (and other electronic devices in the case of collaborative, distributed, or remote computing) may execute instructions for an analysis software package 140 that may be used to implement an improved model-based damage detection technique. The analysis software package 140 may be structured as a single software applications, or as a collection of software application which may exchange data and otherwise interoperate.

The analysis software package 140 may utilize data including a FE model 132 that represents a structure of interest, and measured responses 134 that store results from physical testing of that structure. The FE model 132 may represent the structure in terms of interconnected nodes (i.e. elements) that represent discreet portions or members of the structure. The FE model 132 may be initially configured to model the structure under un-damaged conditions and may be updated, as explained in more detail below, to model selected elements as damaged. The measured responses 134 may represent field-testing data, obtained by attaching sensors (e.g., accelerometers) to various locations on the structure, and measuring the reaction of the structure to vibrational excitation (e.g., applied impulses). The measured responses 134 may, for example, include modal shapes and modal frequencies.

The analysis software package 140 may include a number of modules such as an optimization module 142, a calibration module 144, a FE model solver module 146, and a user interface module 148. As discussed in more detail below, the optimization module 142 may be configured to generate solutions that include a proposed sets of damaged elements and a proposed sets of damage parameters that quantify possible damage, and to evolve the solutions until a stopping criteria is reached. In one implementation, the optimization module 142 is a generic optimization framework, such as the Darwin Optimization Framework available from Bentley Systems Inc. of Exton Pa., which employs a genetic algorithm that relies upon an evaluation criteria to evolve the solutions.

The calibration module 144 may be configured to receive the generated solutions, and to update the FE model 132 based on the solutions. The calibration module 144 may also operate to receive modeled responses for the solutions and the measured responses 134 stored in the memory, and to calculate an error function that is used as evaluation criteria by the optimization module 142. The calibration module may be further configured to update the FE model 132 based on proposed sets of damaged elements and proposed sets of damage parameters produced by the optimization module 142

The FE model solver module 146 may be configured to calculate modeled responses that are provided to the calibration module 144, based on the initial FE model 132 and updated versions of the FE model 132. In one implementation, the FE model solver module 146 is a finite element solver library, such as the OpenSTAAD library available from Bentley Systems Inc. of Exton Pa.

Finally, the user interface module 148 may be configured to display indications (e.g., text, graphics, etc.) on the display screen 170 of final solutions received from the calibration module 144. The final solutions may be those reached when the stopping criteria are met.

The analysis software package 140 and its modules 142-148 may operate to implement an improved model-based damage detection technique that addresses the shortcomings of traditional model-based approaches. The improved damage detection technique may use a discrepancy between modeled response difference and measured response difference as the evaluation criteria. The modeled response difference may be a difference between modeled responses determined from the FE model 132 when it is configured to model initial (e.g., un-damaged) conditions and with selected damaged elements (e.g., a proposed set of damage elements damaged according to a proposed set of damage parameters). The measured response difference may be a difference in measured responses 134 determined from physical testing of the structure under the initial conditions and under the damaged conditions. Using the discrepancy between modeled response difference and a measured response difference as an evaluation criteria may eliminate problems related to uncertainties in the FE model 132 and noise in the measured responses 134, as much of the uncertainties and noise will simply be cancelled out as a result of subtraction operations, as explained further below.

Also, the improved model-based damage detection technique implemented by the analysis software package 140 and its modules 142-148 may limit the number of decision variables to twice a maximum number of damaged elements, where the maximum number of damaged elements is at least an order of magnitude less than the number of elements in the FE model 132, and preferably two orders of magnitude less than the number of elements in the FE model 132. By reducing the dimension of the problem, the technique may enable effective and efficient solution for FE models having hundreds, thousands or even tens of thousands of elements. By being more effective and efficient, the functioning of the electronic device 100 may be improved, since processing requirements, memory consumption, and other burdens may be decreased.

The improved damage detection technique may be premised upon a new damage detection problem formulation. Damage to elements may be modeled by damage parameters that include cross section area or Young's modulus for the element. Let vector $\vec{X}$ represent the damage parameters. The damage detection formulation may be characterized as:

Search for:

$$(\vec{X}, \vec{IDX}) = (x_1, x_2, x_3, \ldots, x_N, idx_1, idx_2, idx_3, \ldots, idx_N) \quad (1)$$

Minimize: $E_T$ (2)

Subject to: $x_i^{min} \leq x_i \leq x_i^{max}, i=1, \ldots, N$ (3)

$id_i \in ID$ (4)

where N is the maximum number of damaged elements subject to the above discussed constraints, $x_i$, i=1, N is the i-th damage parameter, $\vec{IDX}$ is the location vector of the damaged elements, $idx_i$ is the i-th damage element, $E_T$ is an error function that is used for evaluating goodness of fit between the FE model with identified damaged elements and the structure as physically tested under damaged conditions, $x_i^{min}$ and $x_i^{max}$ are the minimum and maximum limits of the damage parameter respectively, and ID represents the set of all the elements in the FE model. Using the formulation in equations (1)-(4), the number of decision variables is 2N (i.e. 2 times the maximum number of damaged elements). N decision variables represent the identity of the damaged elements and N decision variables represent damage parameters for the damage elements. N is selected to be at least an order of magnitude less than the number of elements represented in the FE model, and preferably two orders of magnitude less than the number of elements. For instance, for a FE model with 500 elements, N may be 5, such that the number of decision variables is 10, instead of 500. In this way, the dimension of the problem may be significantly reduced.

To effectively detect the damage element, the evaluation criteria for equation (2) may be selected such that the error function reduces the impact of uncertainty in the FE model and of noise in the measured responses. In one implementation, the impact is reduced by using as the evaluation criteria an error function based on discrepancy (i.e. difference) in modeled responses and in measured responses. The discrepancy may be evaluated by considering model shape and model frequency. A model response discrepancy may be calculated as:

$$E_m = \Sigma_{i=1}^{M} w_i^{\Phi}(\|\Phi_i^{E-H} - \Phi_i^{E-D}\| - \|\Phi_i^{A-H} - \Phi_i^{A-D}\|)^2 \quad (5)$$

$$E_f = \Sigma_{i=1}^{M} w_i^{f\Phi}(|f_i^{E-H} - f_i^{E-D}| - |f_i^{A-H} - f_i^{A-D}|)^2 \quad (6)$$

$$E_T = E_m + E_f \quad (7)$$

where $E_m$ is the discrepancy contributed by the modal shape, $w_i^{\Phi}$ is a weighting coefficient for modal shape i, $\Phi_i^{E-H}$ and $\Phi_i^{E-D}$ are modeled modal shape i under initial (e.g., un-damaged) and damaged conditions respectively, $\Phi_i^{A-H}$ and $\Phi_i^{A-D}$ are measured modal shape i under initial and damaged conditions respectively, where $E_f$ is the discrepancy contributed by the modal frequency, $w_i^f$ is a weighting coefficient for modal frequency i, $f_i^{E-H}$ and $f_i^{E-D}$ are modeled modal frequency i under initial and damaged conditions respectively, $f_i^{A-H}$ and $f_i^{A-D}$ are measured modal shape i under initial and damaged conditions respectively, M is the number of modes.

Figure 2:
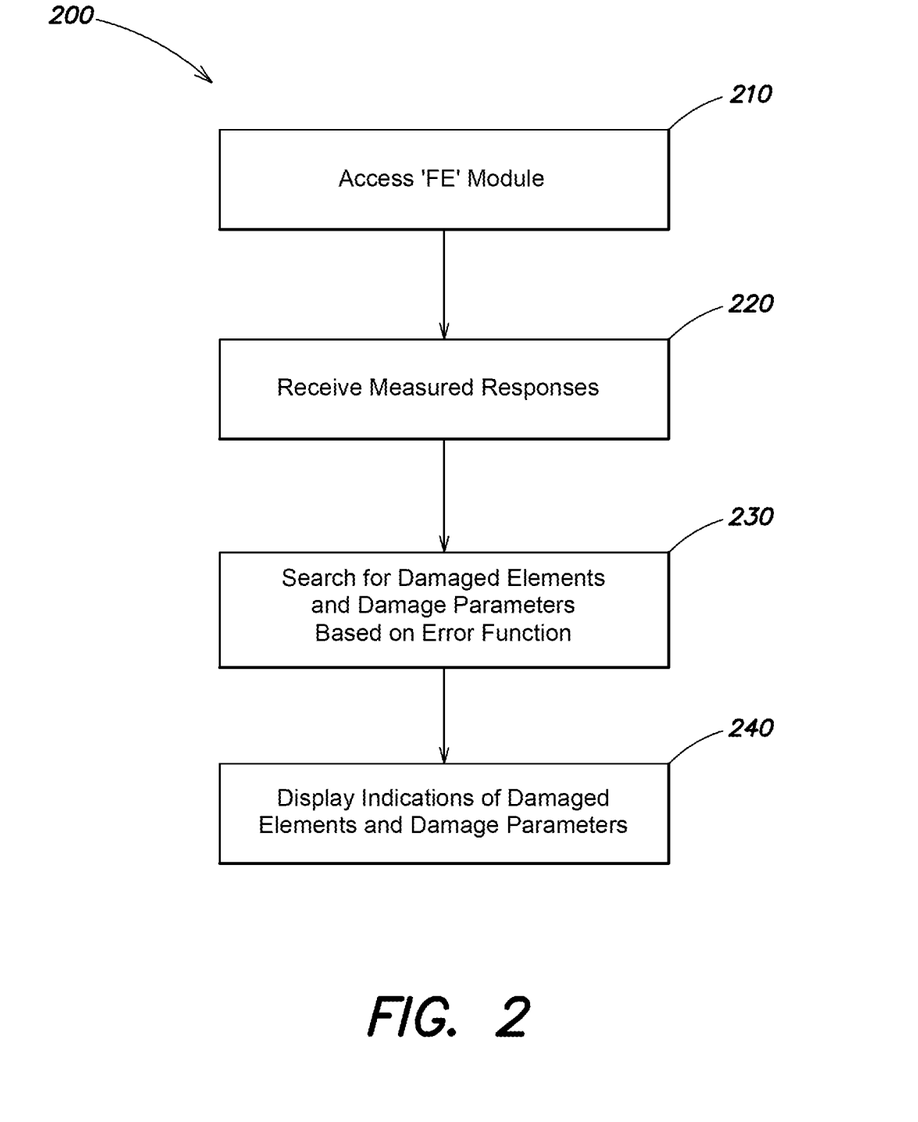
FIG. 2 is a flow diagram of an example generalized sequence of steps that may be implemented to solve a new damage detection formulation.

The damage detection formulation of equations (1)-(7) is an implicit optimization problem with mixed continuous and discrete decision variables that may be solved by the analysis software package 140 and its modules 142-148. FIG. 2 is a flow diagram of an example generalized sequence of steps 200 that may be implemented to solve the new damage detection formulation. The generalized sequence of steps omits interactions between the modules 142-148 to focus on the overall operation. At step 210, the analysis software package 140 may access the finite element (FE) model 132, which may be previously built. At step 220, the analysis software package 140 may receive the measured responses 134. The receipt may take the form of accessing previously stored measured responses 134 in the memory 130. At step 230, the analysis software package 140 may search for a set of damaged elements and damage parameters indicating an amount of damage, wherein the searching is based on an error function, as discussed above. The set of elements may be limited to a maximum number of damaged elements that is at least an order of magnitude (and preferably two orders of magnitude) less than the number of elements in the FE model 132, as also described above. At step 240, the analysis software package 140 may display indications of the set of damaged elements and damage parameters. Thereafter, based on the displayed indications, workers may be directed to repair members of the structure.

Figure 3:
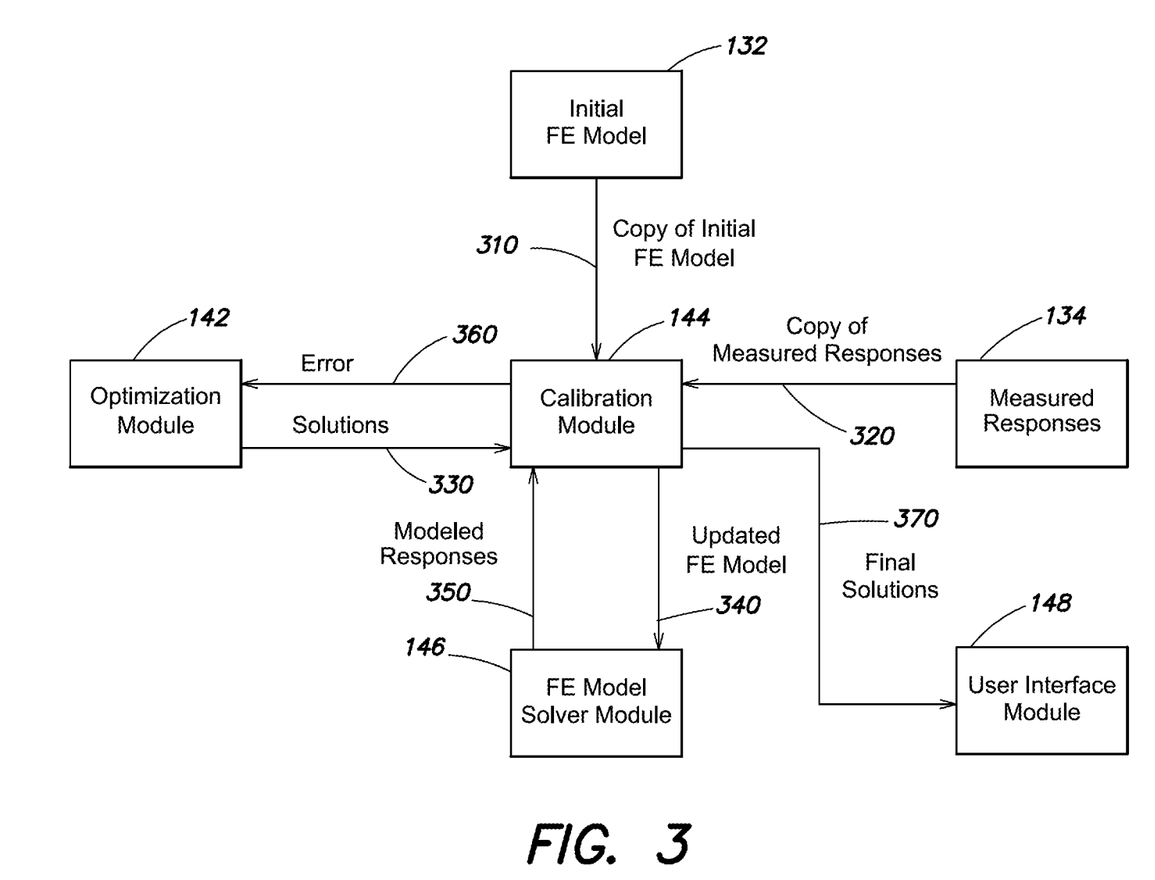
FIG. 3 is a diagram showing example interactions between modules of the analysis software package that may occur to implement the generalized steps of FIG. 2.

FIG. 3 is a diagram showing example interactions between modules 142-148 of the analysis software package 140 that may occur to implement the generalized steps of FIG. 2. Initially, calibration module 144 may receive 310 the FE model 132 and receive 320 the measured responses 134, and call (not shown) the optimization module to generate solutions that include a proposed set of damaged elements and a proposed set of damage parameters. The optimization module 142 may generate the solutions, and provide 330 the solutions back to the calibration module 144. The calibration module 144 may update the FE model 132 to configure it to model the proposed set of damaged elements according to the proposed damage parameters, and provide 340 the updated FE model to the FE model solver module 146. The FE model solver module 146 may analyzing the updated FE model to calculate modeled responses, and provide 350 the modeled responses to the calibration module 144. The calibration module 144 may use the received modeled responses and the measured responses it previously received to calculate an error function based on discrepancy between modeled response difference and measured response difference. The error produced by the error function may be provided 360 to the optimization module 142 which evolves the solutions to minimize the error. The process may be iteratively repeated until a stopping criteria is reached. The stopping criteria may be a maximum number of solutions generated by the optimization module 142, a maximum computation time that the modules are allowed to iterate or a minimum error being reached. When the stopping criteria is reached, the solutions may be returned 370 to the user interface module 148, which may display them.

Figure 4:
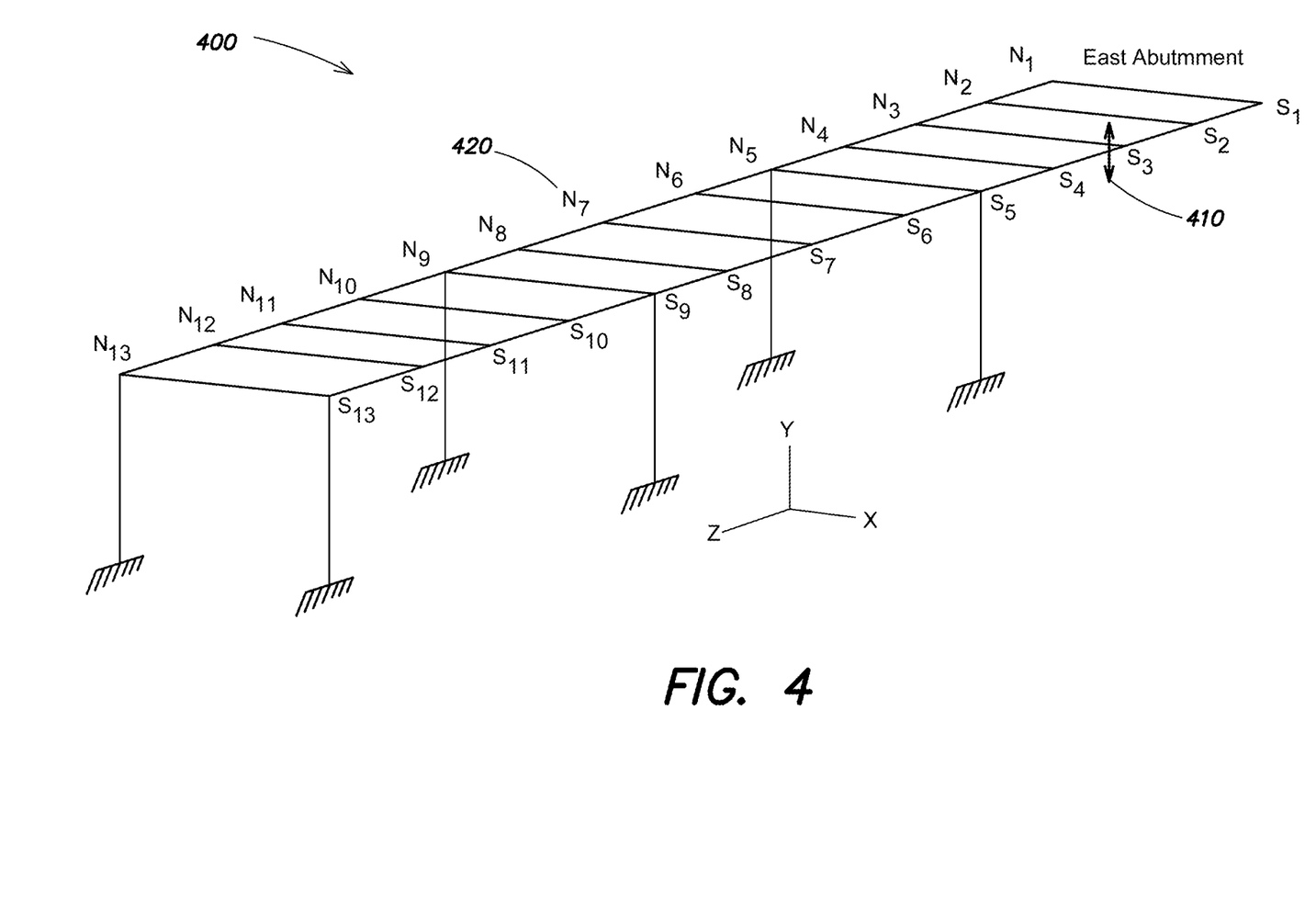
FIG. 4 is a structural layout of an example structure, specifically the I-40 Bridge over the Rio Grande river in New Mexico.

Operation of the improved model-based damage detection technique may be demonstrated by reference to on an example structure. FIG. 4 is a structural layout 400 of an example structure, specifically the I-40 Bridge over the Rio Grande river in New Mexico. This bridge has been established by Los Alamos National Laboratories as a benchmark case for damage detection of highway bridges. The structural layout 400 shows a location 410 where an impulse may be introduced to the bridge (e.g., by a shaker) to be measured by sensors (e.g., accelerometers) as part of physical testing. The structural layout 400 further shows a location 420 of damage.

Figure 5:
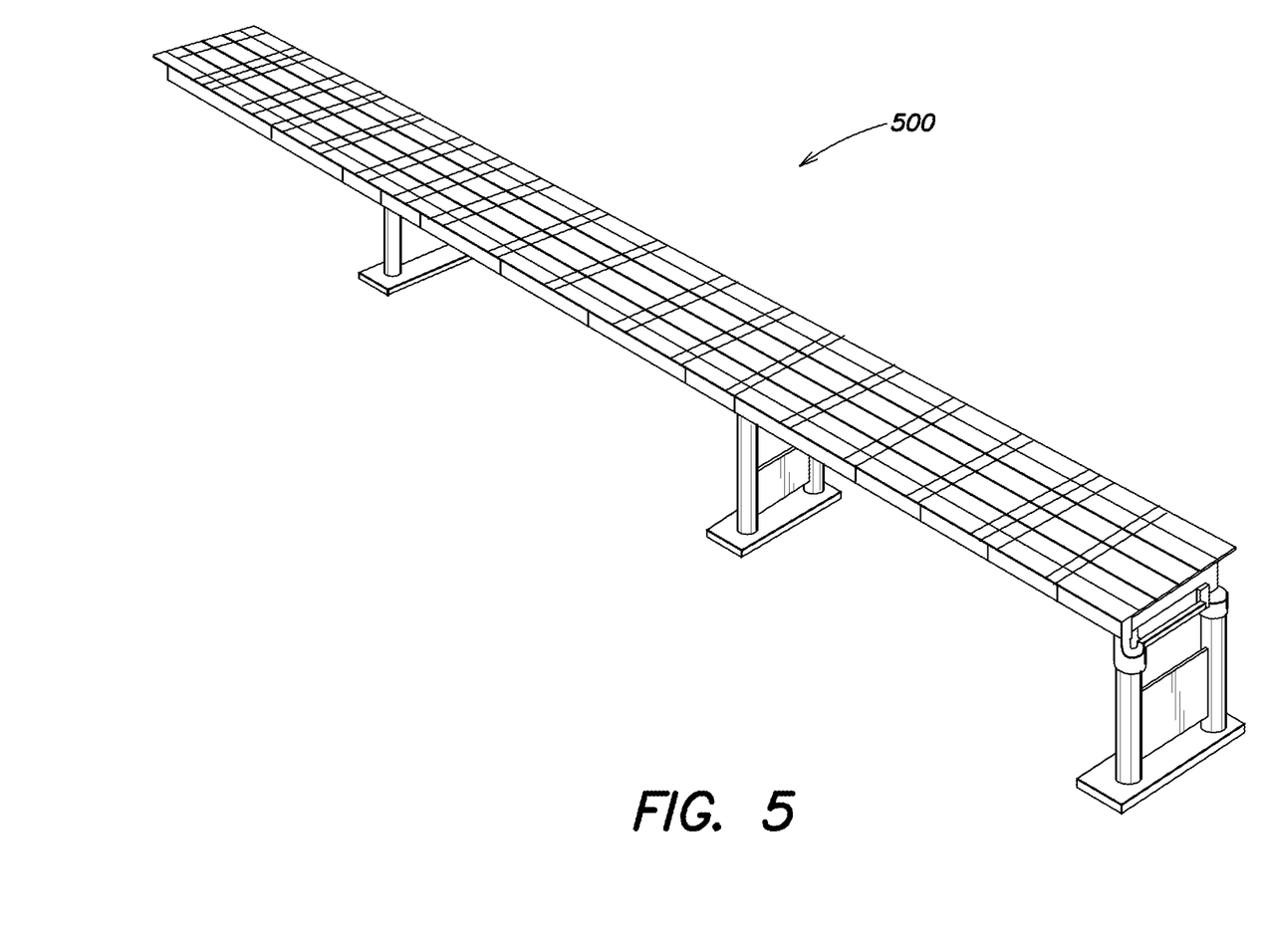
FIG. 5 is a FE model of the example structure of FIG. 4.
Figure 6:
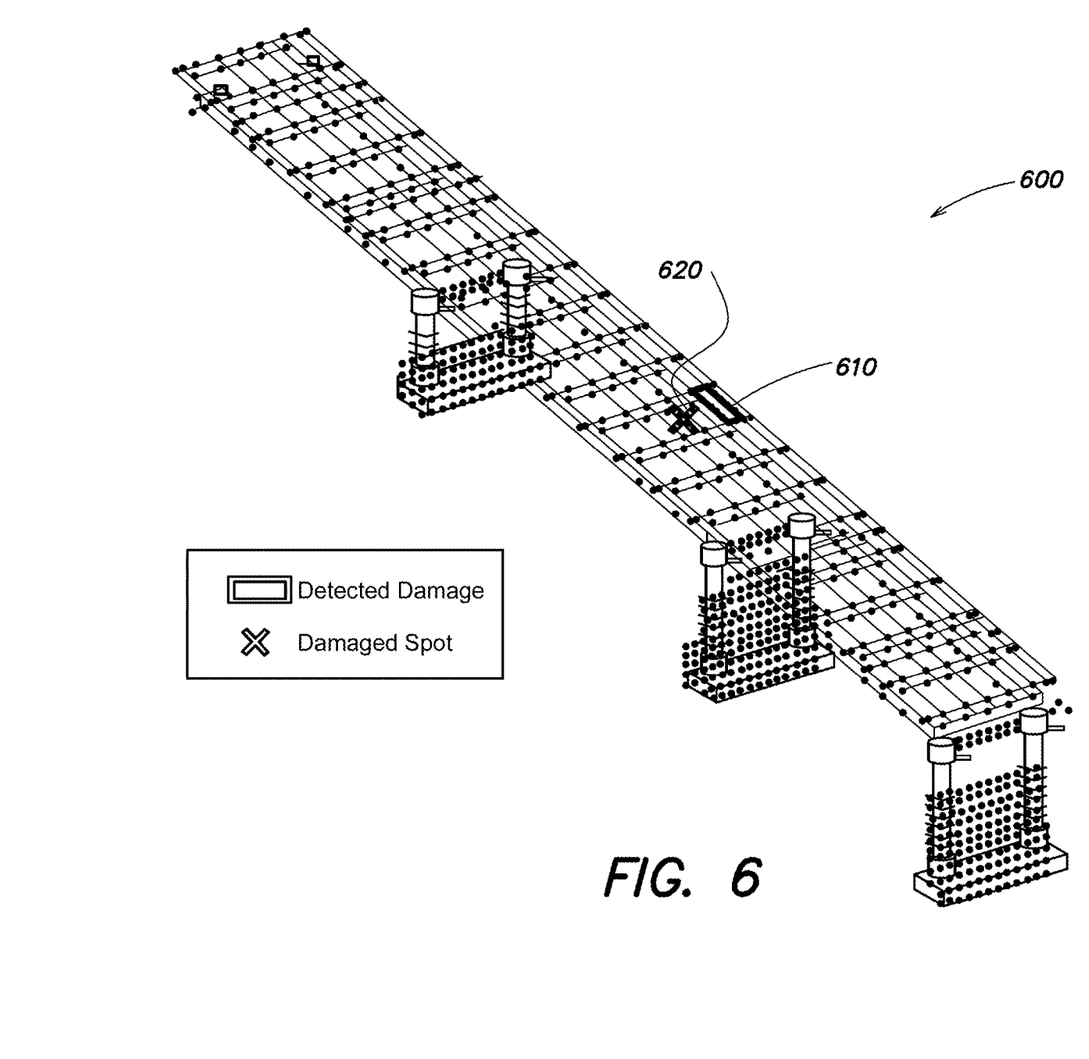
FIG. 6 is an illustration of results of the improved model-based damage detection technique for the example structure of FIGS. 4 and 5.

FIG. 5 is a FE model 500 of the example structure of FIG. 4. The example FE model 500 was created using the STAAD.Pro v8i structural analysis and design application available from Bentley Systems Inc. of Exton Pa. and includes a total of 1417 elements The improved model-based damage detection technique as described above was implemented on the example structure of FIGS. 4 and 5 for testing purposes, using Young's module reduction ratio as the damage parameter for each element. The maximum number of damaged elements was set to 6, leading to a total of 12 decision variables. FIG. 6 is an illustration of results of the improved model-based damage detection technique for the example structure of FIGS. 4 and 5, pursuant to this testing. As can been seen, a location 610 of an identified damaged element closely coincides with a location 620 of actual damage.

In summary, the above-described model-based damage detection technique may offer several improvements over traditional techniques. It should be understood that various adaptations and modifications may be made to the improved technique, to suit various implementations. While a software-based implementation is discussed above, it should be understood that the technique, at least in part, may be implemented in hardware. In general, a variety of software-based implementations, hardware-based implementations, and combinations thereof are contemplated. A software-based implementation may include electronic device-executable instructions stored in a non-transitory electronic device-readable medium, such as a volatile or persistent memory, a hard-disk, a compact disk (CD), or other storage medium. A hardware-based implementation may include specially configured processors, logic circuits, application specific integrated circuits, and/or other types of hardware components. Further, a combined implementation may include both electronic device-executable instructions stored in a non-transitory electronic device-readable medium, as well as one or more specially configured hardware components.

In general, it should be understood that the above descriptions are meant to be taken only by way of example, and are not intended to limit the scope of the invention.

What is claimed is:

1. A method of detecting damage to a structure, comprising:

accessing, by an analysis software package executing on an electronic device, a model of the structure that is stored on a non-transitory electronic device readable medium;

receiving, by the analyses software package, measured responses resulting from physical testing of the structure, the measured responses including responses measured under initial conditions and under damaged conditions;

searching, by the analysis software package, for a set of damaged elements that minimizes error produced by an error function that evaluates goodness-of-fit between the model and the structure under damaged conditions based on a discrepancy between a modeled response difference and a measured response difference, wherein the modeled response difference is a difference between modeled responses determined from the model configured to model initial conditions and configured to model conditions with selected damaged elements, and the measured response difference is a difference in measured responses determined from physical testing of the structure under the initial conditions and under damaged conditions; and displaying, by the analysis software package on a display screen on the electronic device, indications of the set of damaged elements that minimizes the error produced by the error function that evaluates goodness-of-fit between the model and the structure under damaged conditions based on the discrepancy between the modeled response difference and the measured response difference.

2. The method of claim 1, wherein the searching further searches for a set of damage parameters that correspond to the set of damaged elements, the damage parameters indicating an amount of damage.

3. The method of claim 2, wherein the searching utilizes a number of decision variables that is less than or equal to two times the maximum number of damaged elements.

4. The method of claim 1, wherein the model represents a number of elements of the structure, and the searching limits the set of damaged elements to a maximum number of damaged elements, wherein the maximum number of damaged elements is at least an order of magnitude less than the number of elements of the structure.

5. The method of claim 1, wherein the selected damaged elements are a proposed set of damaged elements and the searching further comprises:

generating solutions that include the proposed set of damaged elements and a proposed set of damage parameters that quantify possible damage;

updating the model to represent the proposed set of damaged elements according to the proposed set of damage parameters;

analyzing the updated model to calculate responses;

computing the error function; and evolving the solutions to minimize the error produced by the error function, wherein the updating, analyzing, computing and evolving are iteratively repeated until a stopping criteria is reached, and the solutions at the stopping criteria are returned.

6. The method of claim 5, wherein the stopping criteria is a maximum number of solutions, a maximum computation time or a minimum error.

7. The method of claim 5, wherein the damage parameters include a cross section area or a Young's modulus reduction ratio.

8. The method of claim 5, wherein a genetic algorithm is used to generate and evolve the solutions.

9. The method of claim 1, wherein the discrepancy between the modeled response difference and the measured response difference is based on a combination of difference contributed by modal shape and difference contributed by frequency.

10. The method of claim 1, wherein the initial conditions are healthy conditions.

11. The method of claim 1, wherein the model is a finite element (FE) model.

12. The method of claim 1, further comprising:
based on the displayed indications of the set of damaged elements, repairing one or more members of the structure corresponding to a damaged element.

13. An electronic device comprising:
a display screen;
one or more processors; and
a memory configured to store a model representing elements of a structure, measured responses resulting from physical testing of the structure, and executable instructions for a plurality of software modules that are executable on the one or more processors, the plurality of software modules including:
an optimization module configured to generate solutions that include a proposed set of damaged elements and a proposed set of damage parameters, and to evolve the solutions to minimize an error produced by an error function;
a calibration module configured to receive the solutions and update the model based on the solutions, and to receive modeled responses for the solutions and the measured responses, and to compute the error using the error function based on modeled responses and the measured responses,
an model solver module configured to calculate the modeled responses based on the model as updated, and
a user interface module configured to display a selected solution to a user,
wherein the error function calculates a discrepancy between a modeled response difference and a measured response difference, the modeled response difference is a difference between modeled responses determined from the model configured to model initial conditions and configured to model conditions with selected damaged elements, the measured response difference is a difference in measured responses determined from physical testing of the structure under the initial conditions and under damaged conditions, and the displayed selected solution is a solution that minimizes the error produced by the error function that evaluates goodness-of-fit between the model and the structure under damaged conditions based on the discrepancy between the modeled response difference and the measured response difference.

14. The electronic device of claim 13, wherein the model represents a number of elements of the structure and the optimization module limits the set of damaged elements of each solution to a maximum number of damaged elements, wherein the maximum number of damaged elements is at least an order of magnitude less than the number of elements of the structure.

15. The electronic device of claim 13, wherein the selected solution is selected when a stopping criteria is reached, the stopping criteria being a maximum number of solutions, a maximum computation time or a minimum error.

16. The electronic device of claim 13, wherein the damage parameters include a Young's modulus reduction ratio for each of the selected set of elements.

17. The electronic device of claim 13, wherein the optimization module employs a genetic algorithm to generate and evolve the solutions.

18. A non-transitory electronic device-readable medium having executable instructions stored thereon, the instructions when executed by one or more processors being operable to:
access a model of a structure;
receive measured responses resulting from physical testing of the structure, the measured responses including responses measured under initial conditions and under damaged conditions;
search for a set of damaged elements that minimizes error produced by an error function that evaluates goodness-of-fit between the model and the structure under damaged conditions based on a discrepancy between a modeled response difference and a measured response difference, wherein the modeled response difference is a difference between modeled responses determined from the model configured to model initial conditions and configured to model conditions with selected damaged elements, and the measured response difference is a difference in measured responses determined from physical testing of the structure under the initial conditions and under damaged conditions; and
display indications of the set of damaged elements that minimizes the error produced by the error function that evaluates goodness-of-fit between the model and the structure under damaged conditions based on the discrepancy between the modeled response difference and the measured response difference.

19. The non-transitory electronic device-readable medium of claim 18, wherein the searching further searches for a set of damage parameters that correspond to the set of damaged element, the damage parameters indicating an amount of damage.

* * * * *

UNITED STATES PATENT AND TRADEMARK OFFICE
CERTIFICATE OF CORRECTION

PATENT NO. : 10,295,435 B1
APPLICATION NO. : 14/742330
DATED : May 21, 2019
INVENTOR(S) : Zheng Yi Wu et al.

It is certified that error appears in the above-identified patent and that said Letters Patent is hereby corrected as shown below:

In the Specification

Column 6, Line 21 should read:

$w_i^0$ is a weighting coefficient for modal shape $i$, $\Phi_i^{E-H}$ and

Signed and Sealed this
Thirty-first Day of December, 2019

Andrei Iancu
*Director of the United States Patent and Trademark Office*